US008598530B2

(12) United States Patent
Zhuravleva et al.

(10) Patent No.: US 8,598,530 B2
(45) Date of Patent: Dec. 3, 2013

(54) CHLORIDE SCINTILLATOR FOR RADIATION DETECTION

(75) Inventors: Mariya Zhuravleva, Knoxville, TN (US); Kan Yang, Knoxville, TN (US); Charles L. Melcher, Oak Ridge, TN (US); Piotr Szupryczynski, Knoxville, TN (US)

(73) Assignees: Siemens Medical Solutions USA, Inc., Malvern, PA (US); University of Tennessee Research Foundation, Knoxville, TN (US)

( * ) Notice: Subject to any disclaimer, the term of this patent is extended or adjusted under 35 U.S.C. 154(b) by 215 days.

(21) Appl. No.: 13/098,662

(22) Filed: May 2, 2011

(65) Prior Publication Data

US 2011/0272586 A1 Nov. 10, 2011

Related U.S. Application Data

(60) Provisional application No. 61/332,972, filed on May 10, 2010.

(51) Int. Cl.
*G01T 1/20* (2006.01)
(52) U.S. Cl.
USPC ..................................... 250/362; 250/361 R
(58) Field of Classification Search
USPC ........ 250/362, 361 R, 370.01–370.09, 370.1, 250/370.11–370.15
See application file for complete search history.

(56) References Cited

U.S. PATENT DOCUMENTS

| 4,066,902 | A  | * | 1/1978  | LeMay ............................ 378/12 |
| 6,369,391 | B1 |   | 4/2002  | Hefetz et al. |
| 7,279,120 | B2 | * | 10/2007 | Cheng et al. ............... 252/301.5 |
| 7,368,719 | B2 | * | 5/2008  | Srivastava et al. ......... 250/361 R |
| 8,242,452 | B1 | * | 8/2012  | Shah et al. ................. 250/361 R |
| 2006/0104880 | A1 | * | 5/2006 | Iltis ................................ 423/263 |
| 2007/0267576 | A1 | * | 11/2007 | Loureiro et al. .............. 250/362 |
| 2008/0203309 | A1 | * | 8/2008 | Frach et al. .................... 250/362 |

OTHER PUBLICATIONS

Rastgo Hawrami et al: "Advanced Scintillator materials for Nuclear Radiation Detection",, Apr. 11, 2008, XP55001232, Retrieved from the Internet: URL:http://wwww.sas.aamu.edu/STEM/STEMBooklet08.pdf.*
Partial Search Report dated Sep. 19, 2011 in EP Patent Application EP11165494.
Zhuraleva, et al., "Crystal Growth and Scintillation Properties of Cs3CeCl6 and CsCe2Cl7", Journal of Crystal Growth 318 (Mar. 1, 2011) pp. 809-812.

(Continued)

*Primary Examiner* — David Porta
*Assistant Examiner* — Taeho Jo
(74) *Attorney, Agent, or Firm* — Peter Kendall

(57) ABSTRACT

The present disclosure discloses, in one arrangement, a single crystalline chloride scintillator material having a composition of the formula $A_3MCl_6$, wherein A consists essentially of Cs and M consists essentially of Ce and Gd. In another arrangement, a chloride scintillator material is single-crystalline and has a composition of the formula $AM_2Cl_7$, wherein A consists essentially of Li, Na K, Rb, Cs or any combination thereof, and M consists essentially of Ce, Sc, Y, La, Lu, Gd, Pr, Tb, Yb, Nd or any combination thereof. Specific examples of these scintillator materials include single-crystalline Ce-doped $KGd_2Cl_7$ ($KGd_{2(1-x)}Ce_{2x}Cl_7$) and Ce-doped $CsGd_2Cl_7$ ($CsGd_{2(1-x)}Ce_{2x}Cl_7$).

19 Claims, 19 Drawing Sheets

(56) References Cited

OTHER PUBLICATIONS

Lisek, et al., "High-temperature study of phase equilibria in the systems CsCl-LnCl3 (Cn=Ce, Nd) by Knudsen effusion mass spectrometry", Journal of Thermal Analysis and Calorimetry, vol. 55, (Feb. 1, 1999), pp. 627-637.
Extended EPSearch Report dated Jan. 4, 2012 in EP Patent Application EP11165494.
Zhuraleva, et al., "Crystal growth and scintillation properties of Cs3CeX6 and CsCe2X7 (X=Cl, Br)," Nuclear Science Symposium Conference Record (NSS/MIC), 2010 IEEE , vol., no., pp. 1296-1299, Oct. 30, 2010-Nov. 6, 2010.
Rooh, et al., "The growth and characterization of the cerium contained inorganic halide scintillators" Database Compendex [Online] Engineering Information, XP-002666180, Database accession No. E2010331314, 8249, *abstract*, Key Engineering Materials [Key Eng Mater]. vol. 442, pp. 275-282, 2010.
Rycerz, et al., "Phase diagram and electrical conductivity of the CeBr3-CsBr binary system", J. Therm Anal Calorim (2009) 97:1015-1021.
Glodo, et al; "Cs2LiYCl6 : Ce Scintillator for Nuclear Monitoring Applications", IEEE Transactions on Nuclear Science, vol. 56, No. 3, Jun. 1, 2009, pp. 1257-1261.
Hawrami, R, et al., "Advanced Scintillator Materials for Nuclear Radiation Detection", Alabama A&M University Science, Technology, Engineering & Mathematics Day, Apr. 11, 2008, pp. 55-56.
Bessiere, et al, "Scintillation and Anomalous Emission in Elpasolite Cs2LiLuCl6:Ce3+", Journal of Luminescence 117 (2006) pp. 187-198.
Belikov, K.N., "Analytical Control of Ce Content in CsCexGd2-xCl7 Single Crystals by Inductively Coupled Plasma Atomic Emission Spectrometry", Abstract, retrieved form STN database accession No. 2009:60516, XP002643847, 2008.
Rooh, et al., "The Growth and Scintillation Properties of CsCe2Cl7 Crystal", Journal of Crystal Growth 311 (2008), pp. 128-131.
Meyer, G., "The Reduction of Rare-Earth Metal Halides with Unlike Metals—Woehler's Metallothermic Reduction", Z. Anorg. Allg. Chem., vol. 633, Jan. 1, 2007, pp. 2537-2552.
Karbowiak, M, et al, "Energy Transfer and Upconversion of Nd3+ doped RbY2Cl7", Journal of Luminescence 104 (2003) pp. 197-205.
EP Search Report in Application No. 11165489.3 dated Jul. 11, 2011.
Knoll Glenn F.; "Radiation Detection and Measurement"; General Properties of Radiation Detectors, pp. 95-103; New York (1979).
Higgins, et al, "Bridgman growth of LaBr3:Ce and LaCl3:Ce crystals for high-resolution gamma-ray spectrometers", J. Crystal Growth 287 (2006) 239-242.
Seifert, H.J., "Ternary chlorides of the trivalent early lanthanides: Phase diagrams, crystal structures and thermodynamic properties", J. Thermal Analysis and Calorimetry 67 (2002) 789-826.
Ma, et al, "Thermodynamic calculation of the GdCl3-ACl (A=Na,K,Rb,Cs) phase diagrams based on experimental data", Calphad, vol. 30, Issue 1, Mar. 2006, pp. 88-94.
Seifert, et al, "Structure and Stability of the Low-Temperature Modification of Compounds Cs3LnCl6 (Ln=La-Gd)", Journal of Solid State Chemistry, vol. 107, Issue 1, Nov. 1993, pp. 19-26.
Kapala, et al, "Modelling of the thermodynamic properties of the ABr-CeBr3 (A=Li-Cs ) systems", Calphad, vol. 34, Issue 1, Mar. 2010, pp. 15-19.
Rycerz, et al, "Phase diagram and electrical conductivity of the CeBr3-CsBr binary system", J. Therm. Anal. Calorim. 97 (2009), pp. 1015-1021.
Kramer, et al, "Development and characterization of highly efficient new cerium doped rare earth halide scintillator materials", J. Mater. Chem., 2006, 16, pp. 2773-2780.
Cherepy, et al, "Strontium and barium iodide high light yield scintillators", Applied Physics Letters, vol. 92, (2008), (3 pages).
Xinhua, et al, "Fluorescence spectra of ARE2I5 and AREI3 in the solid state (A [identical to] K, Rb, Cs, Ti; RE [identical to] Sm, Eu)", Journal of Alloys and Compounds, vol. 180, Issues 1-2, Mar. 25, 1992, pp. 235-238.
Baopeng, et al, Synthesis and structure of AEuI3 (A[triple bond; length as m-dash]Rb, Cs) and AEu2I5 (A[triple bond; length as m-dash]K, Rb, Cs), Journal of Alloys and Compounds, vol. 181, Issues 1-2, Proceedings of the 19th Rare Earth Research Conference, Apr. 3, 1992, pp. 511-514.
Guangming, et al, "The study of CsI-EuI2 binary system", [J] Acta Chim. Sinica, 1995,V53(10): 947-951 (English abstract attached).

* cited by examiner

US 8,598,530 B2

CHLORIDE SCINTILLATOR FOR RADIATION DETECTION

CROSS-REFERENCE TO RELATED APPLICATIONS

The present application claims the benefit of U.S. Provisional Application Ser. No. 61/332,972, filed May 10, 2010. The present application also relates to commonly assigned non-provisional U.S. patent application entitled "IODIDE SCINTILLATOR FOR RADIATION DETECTION", filed on the same day as the present application and claiming the benefit of U.S. Provisional Application Ser. No. 61/332,945, filed May 10, 2010 and non-provisional U.S. patent application entitled "HALIDE SCINTILLATOR FOR RADIATION DETECTION", filed on the same day as the present application and claiming the benefit of U.S. Provisional Application Ser. No. 61/332,934, filed May 10, 2010. All applications are incorporated herein by reference.

TECHNICAL FIELD

This disclosure relates to scintillator materials used for detecting ionizing radiation, such as X-rays, gamma rays and thermal neutron radiation, in security, medical imaging, particle physics and other applications. This disclosure relates particularly to chloride scintillator materials. Certain arrangements also relate to specific compositions of such scintillator material, method of making the same and devices with such scintillator materials as components.

BACKGROUND

Scintillator materials, which emit light pulses in response to impinging radiation, such as X-rays, gamma rays and thermal neutron radiation, are used in detectors that have a wide range of applications in medical imaging, particle physics, geological exploration, security and other related areas. Considerations in selecting scintillator materials typically include, but are not limited to, luminosity, decay time and emission wavelengths.

While a variety of scintillator materials have been made, there is a continuous need for superior scintillator materials.

SUMMARY OF THE DISCLOSURE

The present disclosure relates generally to chloride scintillator materials and method of making such scintillator materials. In one arrangement, a chloride scintillator material is single-crystalline and has a composition of the formula $A_3MCl_6$, wherein A consists essentially of Li, Na K, Rb, Cs or any combination thereof, and M consists essentially of Ce, Sc, Y, La, Lu, Gd, Pr, Tb, Yb, Nd or any combination thereof. In another arrangement, a chloride scintillator material is single-crystalline and has a composition of the formula $AM_2Cl_7$, wherein A consists essentially of Li, Na K, Rb, Cs or any combination thereof, and M consists essentially of Ce, Sc, Y, La, Lu, Gd, Pr, Tb, Yb, Nd or any combination thereof. Specific examples of these scintillator materials include single-crystalline $Cs_3CeCl_6$, $CsCe_2Cl_7$, Ce-doped $KGd_2Cl_7$ ($KGd_{2(1-x)}Ce_{2x}Cl_7$) and Ce-doped $CsGd_2Cl_7$ ($CsGd_{2(1-x)}Ce_{2x}Cl_7$).

A further aspect of the present disclosure relates to a method of making chloride scintillator materials of the above-mentioned compositions. In one example, high-purity starting chlorides (such as CsCl and $CeCl_3$) are mixed and melted to synthesize a compound of the desired composition of the scintillator material. A single crystal of the scintillator material is then grown from the synthesized compound by the Bridgman method, in which a sealed ampoule containing the synthesized compound is transported from a hot zone to a cold zone through a controlled temperature gradient at a controlled speed to form a single-crystalline scintillator from molten synthesized compound.

DETAILED DESCRIPTION

I. Overview

Figure 1:
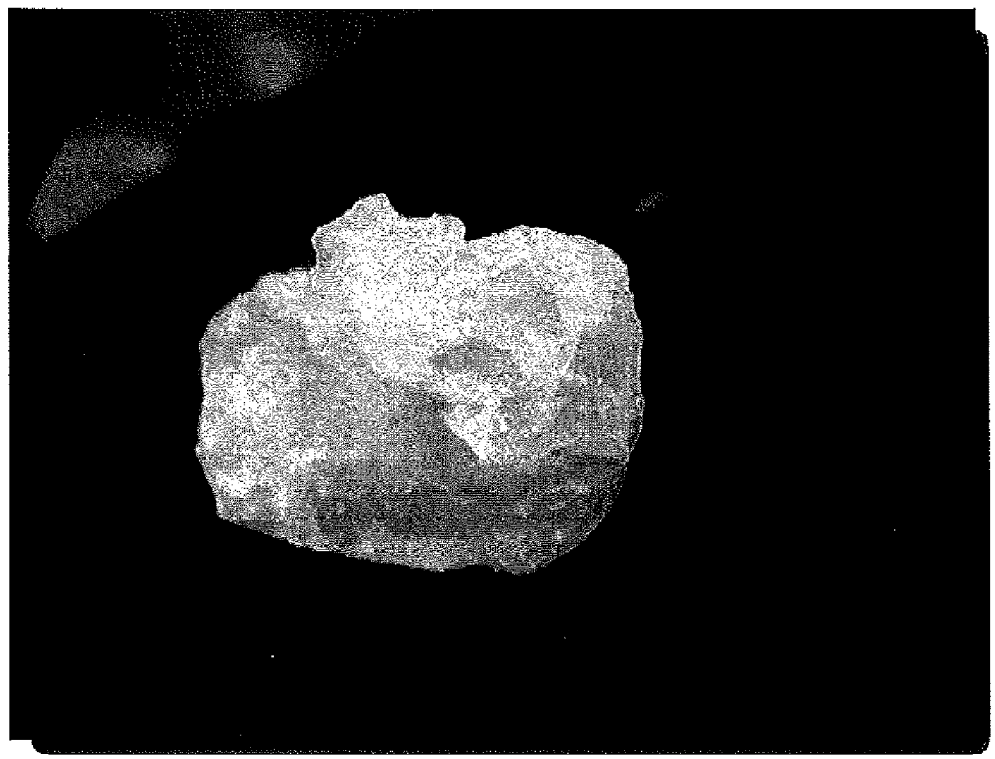
FIG. 1 shows a single crystal of $Cs_3CeCl_6$ made according to one aspect of the present disclosure.

Inorganic scintillators are commonly used in nuclear and high-energy physics research, medical imaging, homeland security, and geological exploration. These materials typically possess sufficient stopping power for detection, high luminosity, high spectral energy resolution at room temperature and short decay time. Certain cerium-doped halides, such as $LaCl_3$:Ce and $LaBr_3$:Ce, have satisfactory scintillation properties at room temperature for gamma ray detection. Another desirable property of scintillators is a capability of neutron-gamma discrimination that is of importance for nuclear non-proliferation applications. Materials containing gadolinium, lithium and boron are employed to quickly and efficiently discriminate neutrons from gamma rays. Halide scintillators reported to date are produced mainly by the conventional Bridgman crystal growth method.

In one aspect of present disclosure, a chloride scintillator material is a single-crystalline material and has a composition of the formula $A_3MCl_6$, wherein A consists essentially of Li, Na, K, Rb, Cs or any combination thereof, and M consists essentially of Ce, Sc, Y, La, Lu, Gd, Pr, Tb, Yb, Nd or any combination thereof. In another aspect, a chloride scintillator material is a single-crystalline material and has a composition of the formula $AM_2Cl_7$, wherein A consists essentially of Li, Na K, Rb, Cs or any combination thereof, and M consists essentially of Ce, Sc, Y, La, Lu, Gd, Pr, Tb, Yb, Nd or any combination thereof. Specific examples of these scintillator materials include single-crystalline $Cs_3CeCl_6$, $CsCe_2Cl_7$, Ce-doped $KGd_2Cl_7$ ($KGd_{2(1-x)}Ce_{2x}Cl_7$) and Ce-doped $CsGd_2Cl_7$ ($CsGd_{2(1-x)}Ce_{2x}Cl_7$).

$Cs_3CeCl_6$ and $CsCe_2Cl_7$ are congruently inciting compounds that exist in $CsCl$—$CeCl_3$ system. This fact makes $Cs_3CeCl_6$ and $CsCe_2Cl_7$ suitable for practical crystal growth from a melt. $Cs_3CeCl_6$ has a density of 3.4 g/cm$^3$, melts congruently at 804° C. and undergoes a solid-solid state transition at 401° C. Its high-temperature modification crystallizes in the cubic elpasolite type and a low-temperature modification in a monoclinic crystal structure. $CsCe_2Cl_7$ has a density of 3.6 g/cm$^3$ and a hexagonal crystal structure $KGd_2Cl_7$ has an monoclinic crystal structure and melts congruently at 573° C. $CsGd_2Cl_7$ have a orthorhombic crystal structure and melts congruently at 680° C. Therefore they both can be grown from the melt.

In one aspect of the present disclosure, a method of growing a scintillator crystal described above includes synthesizing a compound of the composition discussed above and then growing a scintillator crystal from the synthesized compound. In one example, the synthesized compound is sealed in a quartz ampoule, which is pulled In another aspect of the present disclosure, the above-described scintillator materials are used in radiation detection by scintillation. For example, a radiation detector can include a scintillator described above for generating photons in response to the impinging radiation. The scintillator is optically coupled to a photon detector, such as a photomultiplier tube (PMT), arranged to receive the photons generated by the scintillator and adapted to generate a signal indicative of the photon generation.

II. Example Configurations (a) Scintillator Crystal Growth

In one arrangement, a modified 24-zone Electro-Dynamic Gradient Mellen furnace with a translation mechanism was used to grow $Cs_3CeCl_6$ and $CsCe_2Cl_7$ single crystals via the Bridgman technique. As a first step, these compounds were synthesized by mixing and melting starting anhydrous chlorides in quartz ampoules. Quartz ampoules were first baked and freshly cleaned by rinsing with a dilute HF solution and deionized water. High purity, anhydrous beads of starting compounds (e.g., CsCl and $CeCl_3$ for $Cs_3CeCl_6$ and $CsCe_2Cl_7$; KCl and $GdCl_3$ for $KGd_2Cl_7$ and CsCl and $GdCl_3$ for $CsGd_2Cl_7$) (available from Sigma-Aldrich)) were loaded into the cylindrical quartz ampoules in a nitrogen-purged glove box and sealed under $10^{-6}$ mbar vacuum with a hydrogen torch. The relative amounts of the starting compounds in one arrangement were chosen to, achieve stoichiometry, of the synthesized scintillator material. Examples include 3 CsCl:1 $CeCl_3$ for $CS_3CeCl_6$ and 1 CsCl:2 CeCl3 for $CSCe_2Cl_7$ (molecular ratios). Other ratios can be used for desired degree of stoichiometry.

The ampoule was heated up to, for example, 850° C., which is above the melting points of the starting chlorides. Then the synthesized compound was loaded into a specially designed quartz ampoule of about ½ in diameter to grow a single crystal, During the growth, the ampoule travels through the furnace from a hot zone (at a temperature which is above the inciting point of the composition) to a cold zone (at a temperature which is below the inciting point of the composition) at a rate of ~1-2 mm/h. Cooling down was done at a rate of about 10° C./h. After the crystals were grown and removed from the growth ampoules, they were stored in mineral oil to protect from the atmosphere.

(b) Characterization of Scintillator Crystals

Certain samples were characterized without polishing while for certain others, plates of about 1-2 mm thickness were cut from the boules and polished using a set of sand papers and mineral oil. To identify the obtained phase, powder X-ray diffraction (XRD) analysis was carried out in air at room temperature. To minimize the effects of self-absorption, small samples (typically 1-2 mm thick, 3 mm×3 mm) were selected for the optical characterization.

Photoluminescence spectra were obtained with a Horiba Jobin Yvon Fluorolog3 spectrofluorometer equipped with Xe lamp and monochromators. Scintillation time profiles were recorded using the time-correlated single photon technique and a $^{137}Cs$ gamma-ray source. Radioluminescence spectra were measured at—room temperature under continuous irradiation, from an X-ray generator (35 kV and 0.1 mA). Light output measurements were carried out on samples covered in mineral oil and directly coupled to a photomultiplier tube (PMT) and covered with Teflon tape. A Hamamatsu 3177-50 PMT was used for absolute light output measurements. Gamma-ray energy spectra were recorded using a $^{137}Cs$ source with a 2 ms shaping time. The integral quantum efficiency of the PMT according to the emission spectrum of the scintillators was used to calculate the number of photons per unit gamma ray energy. The energy resolution, at 662 keV was determined from the full-width at half-maximum (FWHM) of the 662 keV photopeak.

(c) Example Results

Figure 2:
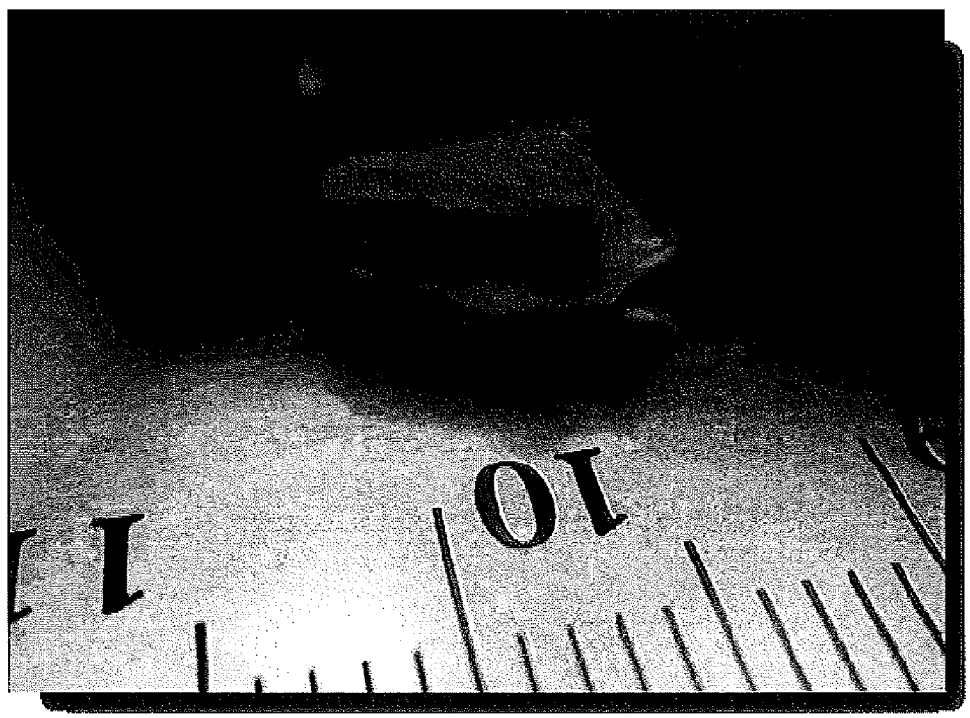
FIG. 2 shows a single crystal of Ce-doped $KGdCl_7$ ($KGd_{2(1-x)}Ce_{2x}Cl_7$) made according to one aspect of the present disclosure.
Figure 3:
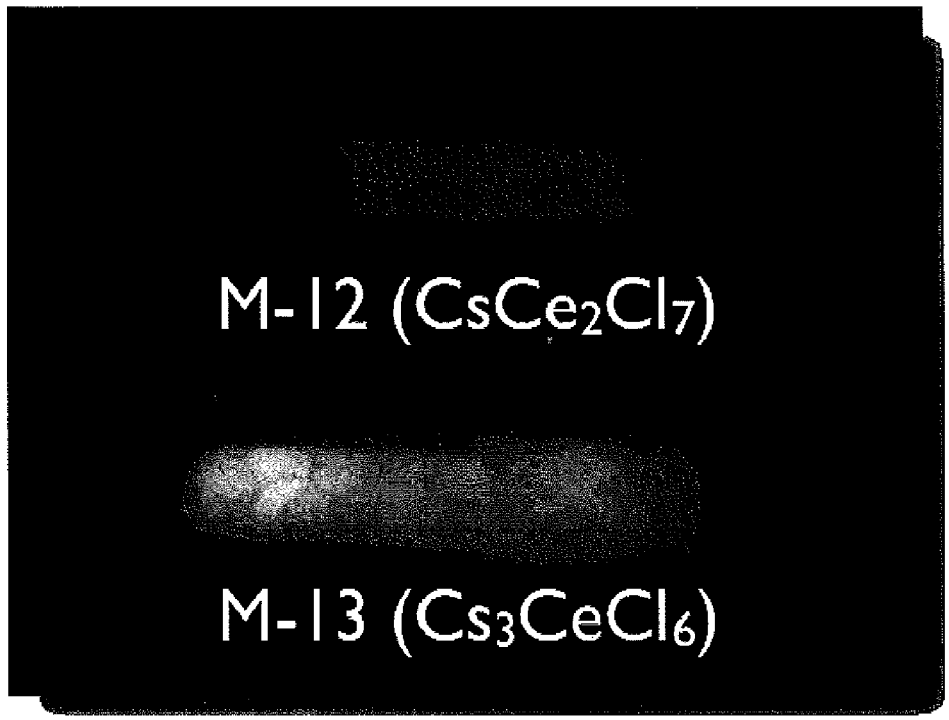
FIG. 3 shows a single crystal of $CsCe_2Cl_7$ (upper) and a single crystal of $Cs_3CeCl_6$ (lower) made according to one aspect of the present disclosure. The images were taken with the samples under ultraviolet excitation.

According to certain aspects of the present disclosure, single crystals of the chloride materials suitable for scintillator applications were made, and their scintillation properties were measured. A single crystal of $Cs_3CeCl_6$ made using the Bridgman method as described above is shown in the image in FIG. 1. The sample is approximately 1 cm across and slightly translucent. FIG. 2 shows a single crystal of Ce-doped $KGd_2Cl_7$ ($KGd_{2(1-x)}Ce_{2x}Cl_7$) made using the Bridgman method described above. The sample is approximately 1 cm across and slightly translucent. FIG. 3 shows a single crystal of $CsCe_2Cl_7$ (upper image) and a single crystal of $Cs_3CeCl_6$ (lower image) made using the Bridgman method. The samples showed fluorescence under UV excitation.

Figure 4:
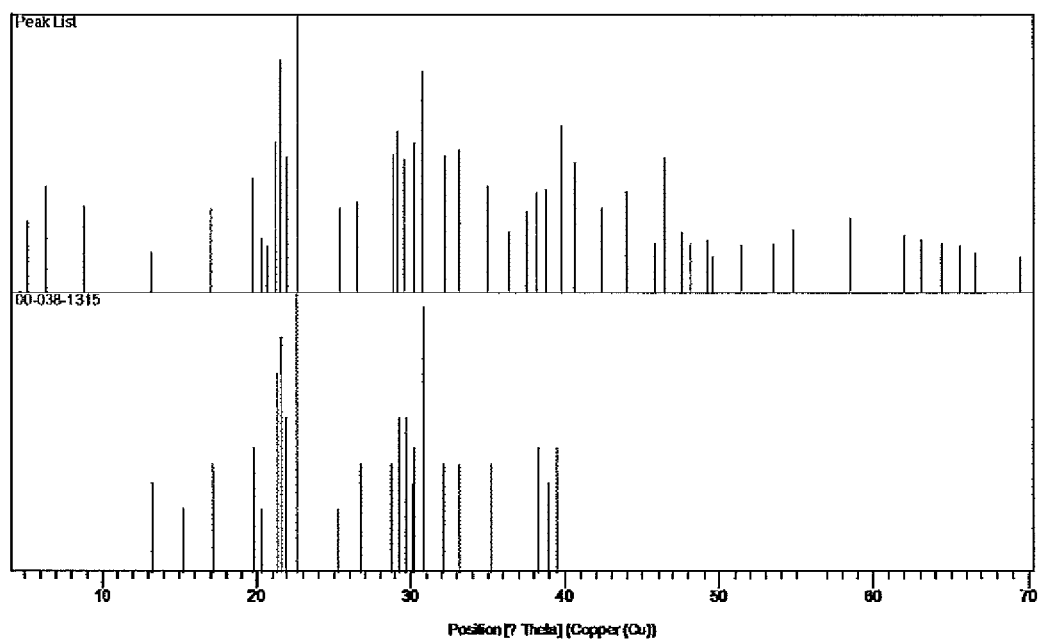
FIG. 4 shows a power X-ray diffraction pattern (upper spectrum) of a $Cs_3CeCl_6$ crystal sample; the material is identified as a single phase from the PCPDF database, Ref. No. 00-038-1315 (lower spectrum).

The above samples were confirmed to be single phase by X-ray diffraction analysis. As an example, FIG. 4 shows a power X-ray diffraction (XRD) pattern (upper) of a $CsCe_2Cl_7$ sample from the crystal sample shown in FIG. 3. The material is identified as a single phase from the PCPDF database, Ref. No. 00-038-1315 (lower spectrum in FIG. 3).

Figure 5A:
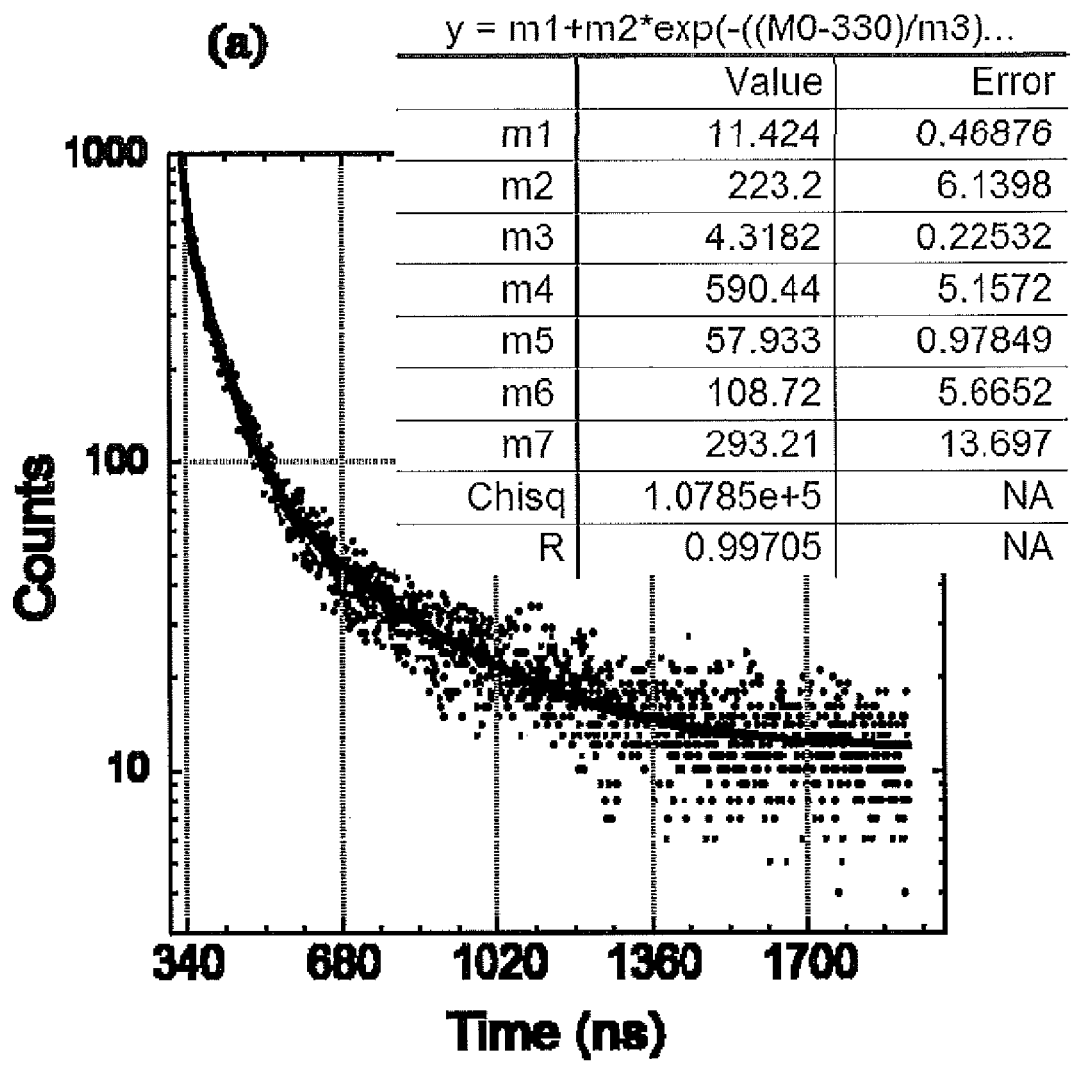
FIG. 5(a) shows a scintillation decay time spectrum of a $Cs_3CeCl_6$ crystal; the spectrum was measured using $^{137}Cs$ gamma-ray source (662 keV).
Figure 5B:
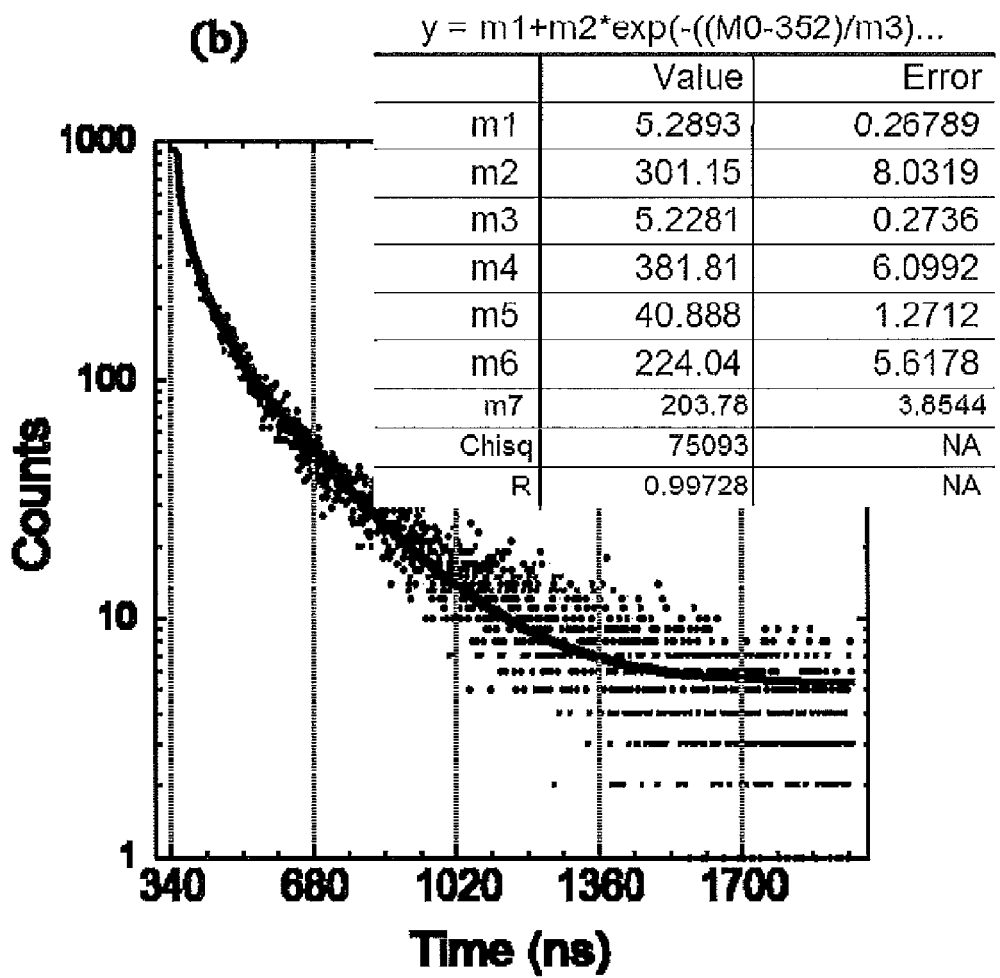
FIG. 5(b) shows a scintillation decay time spectrum of a $KGd_2Cl_7$:Ce 1% ($KGd_{2(1-x)}Ce_{2x}Cl_7$, x=0.01) crystal; the spectrum was measured using $^{137}Cs$ gamma-ray source (662 keV).

The single crystal scintillators described above have demonstrated high performance under optical, X-ray, gamma ray, and thermal neutron excitations. These scintillators exhibit Ce 5d-4-f luminescence. FIG. 5(a) shows a scintillation decay time spectrum of a $Cs_3CeCl_6$ crystal; the spectrum was measured using $^{137}Cs$ gamma-ray source (662 keV). The scintillation decay curve can be fitted with a double exponential function: ~60 ns (48%) and ~300 (52%). FIG. 5(b) shows a scintillation decay time spectrum of a $KGd_2Cl_7$:Ce 1% ($KGd_{2(1-x)}Ce_{2x}Cl_7$, x=0.01) crystal; the spectrum was measured using $^{137}Cs$ gamma-ray source (662 keV). The scintillation decay time has a short component of ~40 ns (27%) and a long component of ~200 ns (73%).

Figure 6:
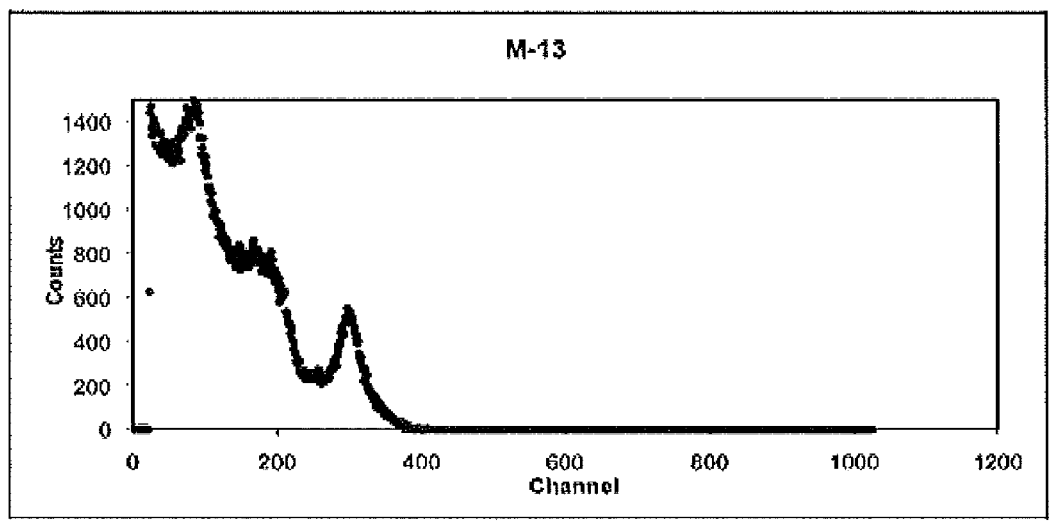
FIG. 6 shows an energy spectrum of a $Cs_3CeCl_6$ crystal, indicating a photopeak at about channel no. 300 (normalized, with the photopeak of a BGO standard sample at channel no. 100); the spectrum was measured using $^{137}Cs$ gamma-ray source (662 keV).
Figure 11:
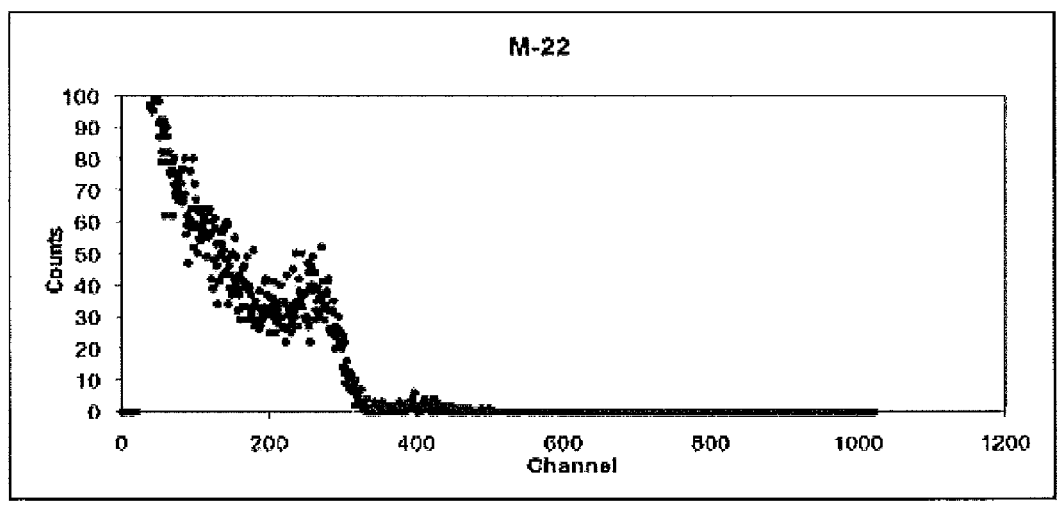
FIG. 11 shows an energy spectrum of a $KGd_2Cl_7$:Ce ($KGd_{2(1-x)}Ce_{2x}Cl_7$, x=0.01) 1% crystal, indicating a photopeak at about channel no. 400 (normalized, with the photopeak of a BGO standard sample at channel no. 100); the spectrum was measured using $^{137}Cs$ gamma-ray source (662 keV).

FIG. 6 shows an energy spectrum of a $Cs_3CeCl_6$ crystal, indicating a photopeak at about channel no. 300 (normalized, with the photopeak of a BOO standard sample at channel no. 100). FIG. 11 shows an energy spectrum of a $KGd_2Cl_7$:Ce 1% ($KGd_{2(1-x)}Ce_{2x}Cl_7$, x=0.01) crystal, indicating a photopeak at about channel no. 400 (normalized, with the photopeak of a BGO standard sample at channel no. 100). The spectra in FIGS. 6 and 11 were measured using $^{137}Cs$ gamma-ray source (662 keV). The light output of the scintillators exceeds about 4 times that of a BGO standard sample. The estimated light output of $CsCe_2Cl_7$ is at least ~30,000 photons/MeV, $Ce_3CeCl_6$ ~35,000 photons/MeV and KGd2Cl_7:Ce 1% ($KGd_{2(1-x)}Ce_{2x}Cl_7$, x=0.01) ~40,000 photons/MeV. The measurements above were carried out on unpolished samples.

Figure 7:
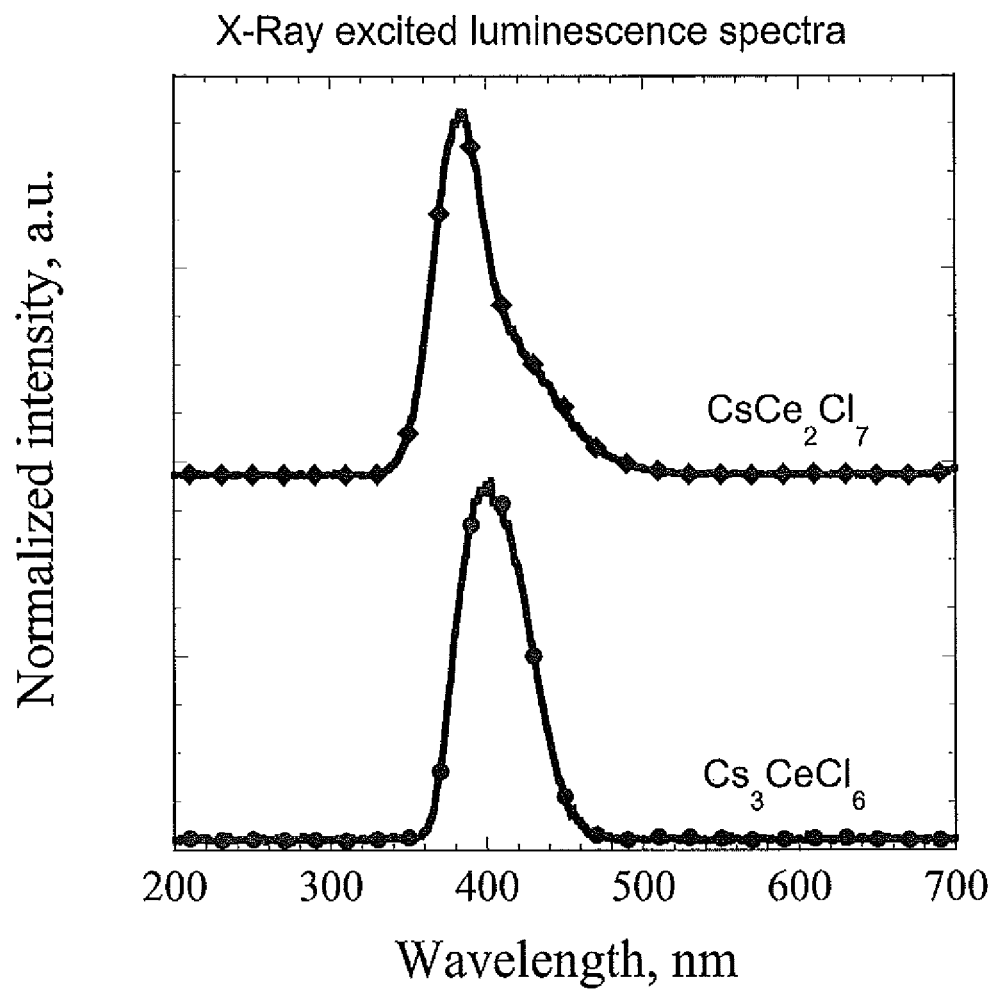
FIG. 7 shows radioluminescence spectra of $Cs_3CeCl_6$ and $CsCe_2Cl_7$ single crystals under the excitation of X-rays.

Measurements on additional, polished samples were performed. FIG. 7 shows radioluminescence (X-ray excited emission) spectra of $Cs_3CeCl_6$ and $CSCe_2Cl_7$ single crystals, respectively. The crystals exhibit emission bands centered at approximately 400 nm for $Cs_3CeCl_6$ and 385 nm for $CsCe_2Cl_7$; both peaks can be attributed to the Ce emission.

Figure 8:
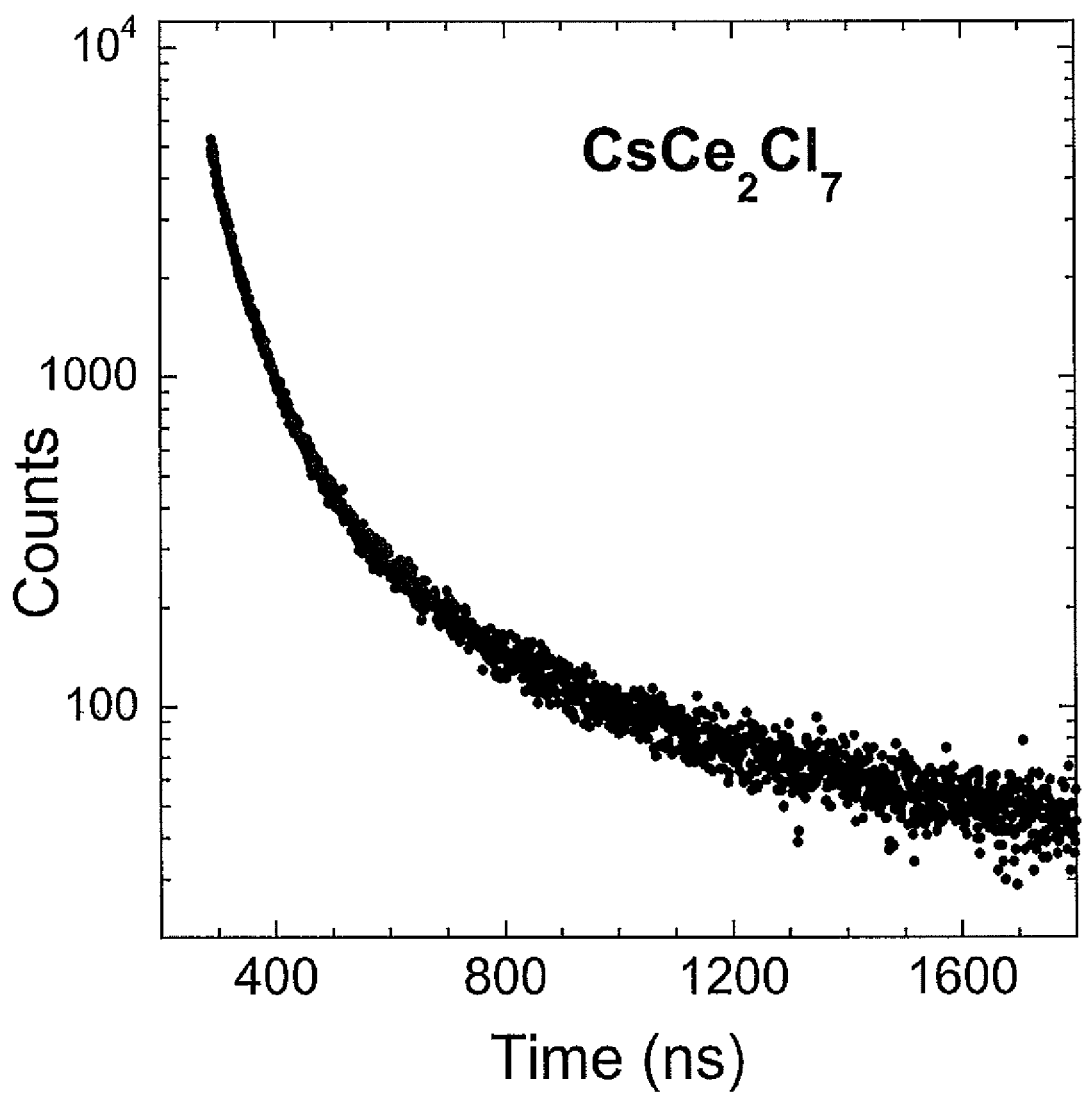
FIG. 8 shows a scintillation decay time spectrum of a $CsCe_2Cl_7$ single crystal; the spectrum was measured using $^{137}Cs$ gamma-ray source (662 keV).
Figure 9:
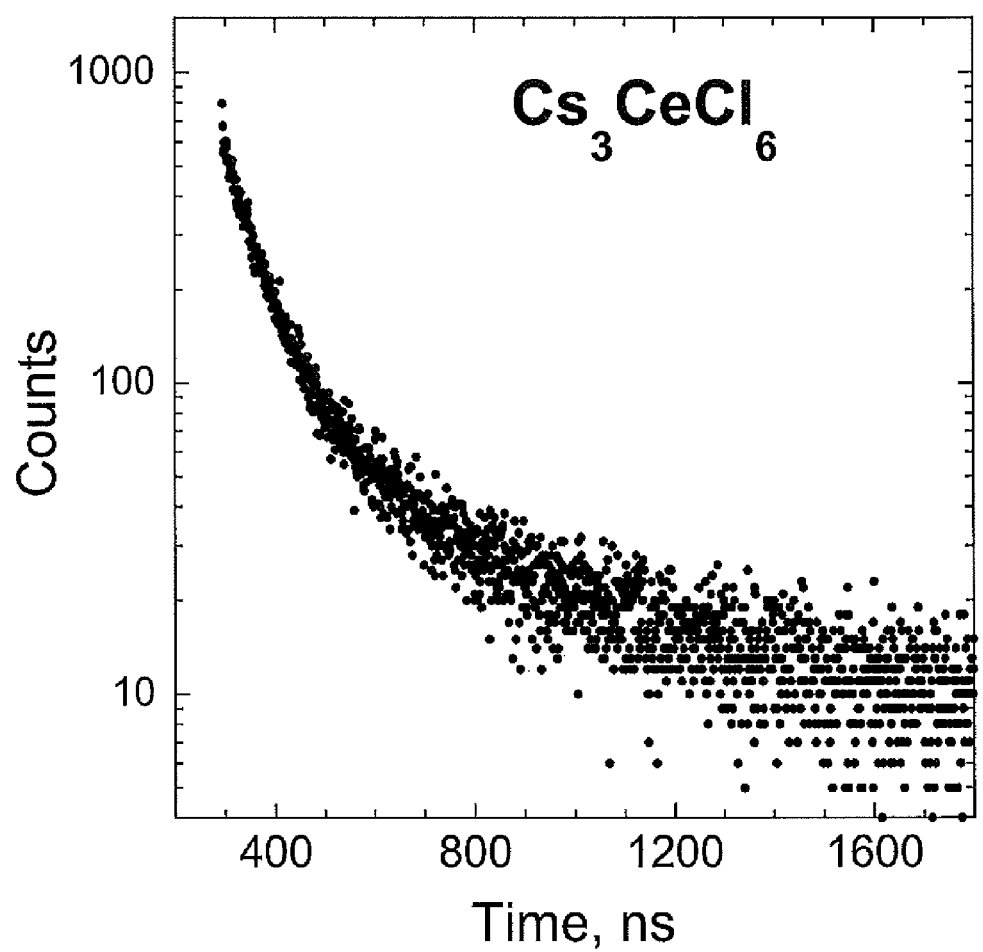
FIG. 9 shows a scintillation decay time spectrum of a $Cs_3CeCl_6$ single crystal; the spectrum was measured using $^{137}Cs$ gamma-ray source (662 keV).

FIG. 8 shows a scintillation decay time spectrum of a $CsCe_2Cl_7$ single crystal; FIG. 9 shows a scintillation decay time spectrum of a $Cs_3CeCl_6$ single crystal. Both spectra were obtained using $^{137}Cs$ gamma-ray source (662 keV). The spectra for both $Cs_3CeCl_6$ and $CsCe_2Cl_7$ were fitted with curves of a double exponential function, with a primary component of ~50 ns and a secondary component in the range of ~200-300 ns. The fraction of the fast component is around 50%.

Figure 10:
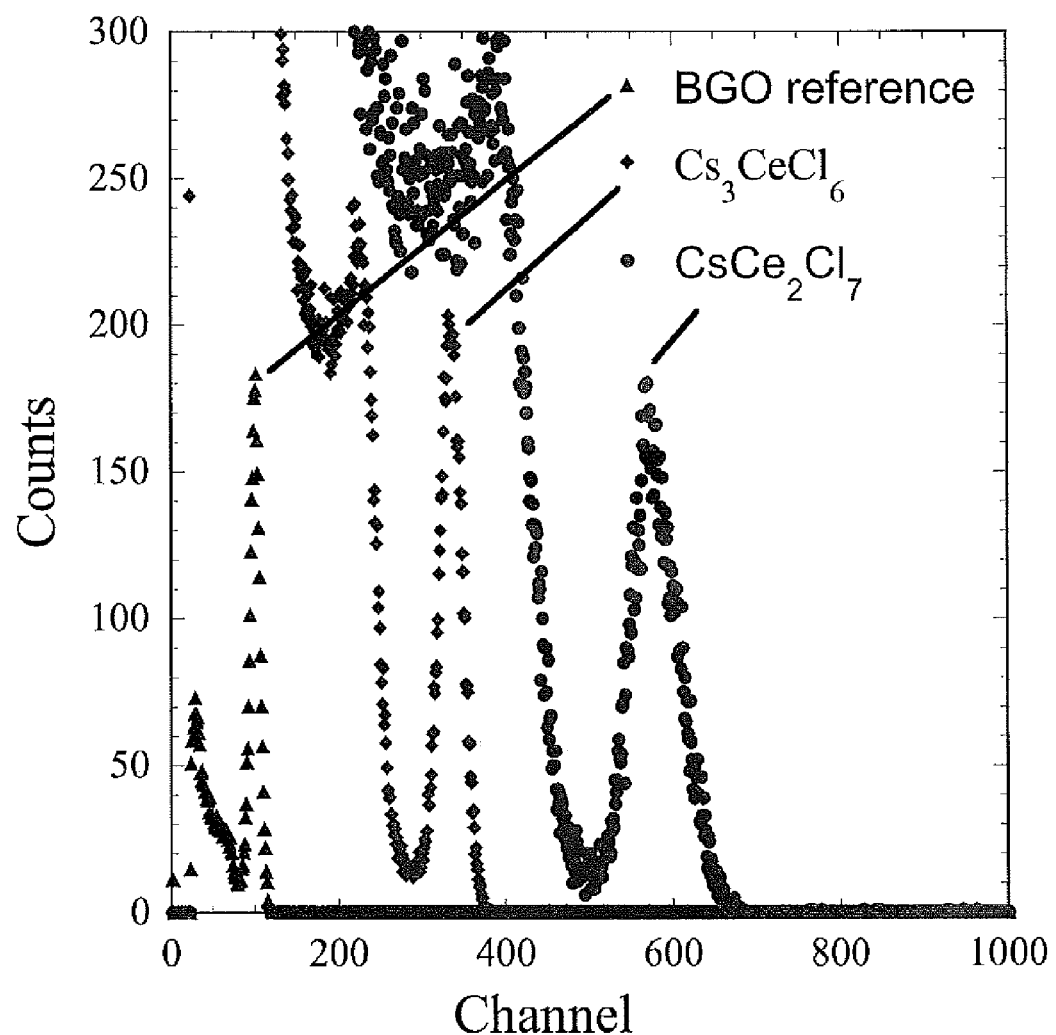
FIG. 10 shows energy spectra of $Cs_3CeCl_6$ and $CsCe_2Cl_7$ single crystals as compared to that of a BGO reference sample; the spectrum was measured using $^{137}Cs$ gamma-ray source (662 keV).

FIG. 10 shows gamma-ray energy spectra of $Cs_3CeCl_6$ and $CsCe_2Cl_7$ single crystals as compared to that of a BGO reference sample; the spectrum was measured using $^{137}Cs$ gamma-ray source (662 keV). The absolute light output of 19,000 photons/MeV, and the energy resolution 8.4% (FWHM over peak position) were measured for $Cs_3CeCl_6$. For $CsCe_2Cl_7$, the absolute light output was 26,000 photons/MeV, with 7.5% energy resolution for 662 keV gamma rays. Table I summarizes common physical and scintillation characteristics of the $CsCe_2Cl_7$ and $Cs_3CeCl_6$ crystals.

TABLE I

Physical and scintillation characteristics of $CsCe_2Cl_7$ and $Cs_3CeCl_6$.

| Composition | Density, g/cm³ | $Z_{eff}$ | Photoelectric fraction, % at 140 keV | Scintillation decay, ns | Light output, ph/MeV | Energy resolution, % at 662 keV | RL peak max, nm |
|---|---|---|---|---|---|---|---|
| $CsCe_2Cl_7$ | 3.6 | 48.0 | 82 | 50 (52%) + 210 (48%) | 26,000 | ~7.5 | 385 |
| $Cs_3CeCl_6$ | 3.4 | 49.3 | 83 | 50 (50%) + 300 (50%) | 19,000 | ~8.4 | 400 |

Figure 12:
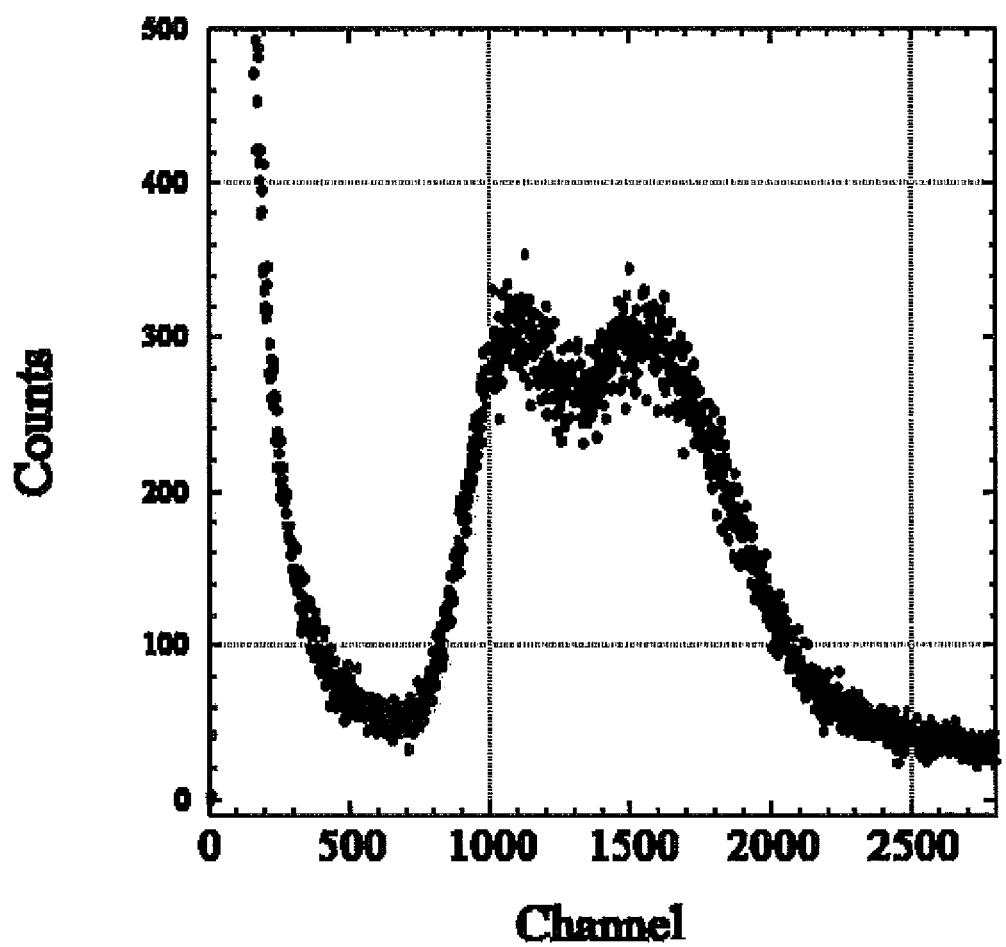
FIG. 12 shows an energy spectrum of $KGd_2Cl_7$:Ce 1% ($KGd_{2(1-x)}Ce_{2x}Cl_7$, x=0.01) showing 33 and 77 keV peaks, characteristic for thermal neutron interaction with Gd; measured using a $^{252}Cf$ thermal neutron source. The sample was shielded from the gamma-rays.
Figure 13:
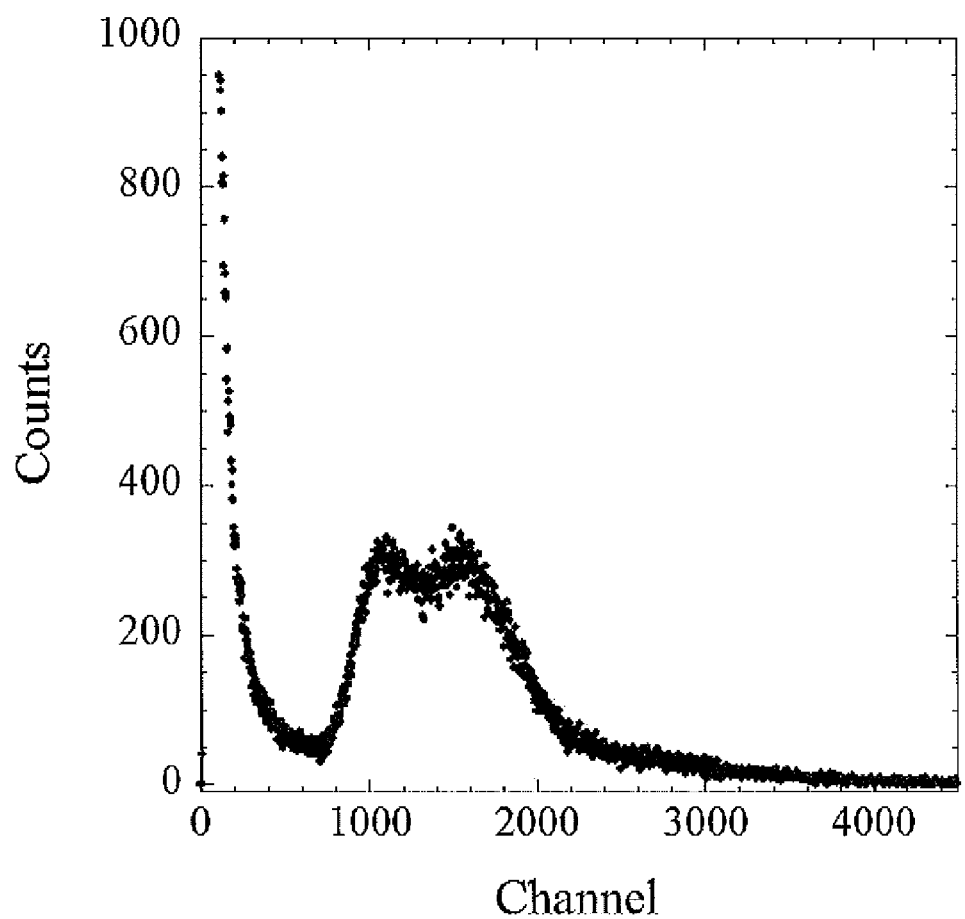
FIG. 13 shows an energy spectrum of a $KGd_2Cl_7$:Ce 1% ($KGd_{2(1-x)}Ce_{2x}Cl_7$, x=0.01) crystal, showing peaks at about 34 and 74 keV; the spectrum was measured using $^{252}Cf$ neutron source, with the sample shielded from gamma rays.
Figure 18:
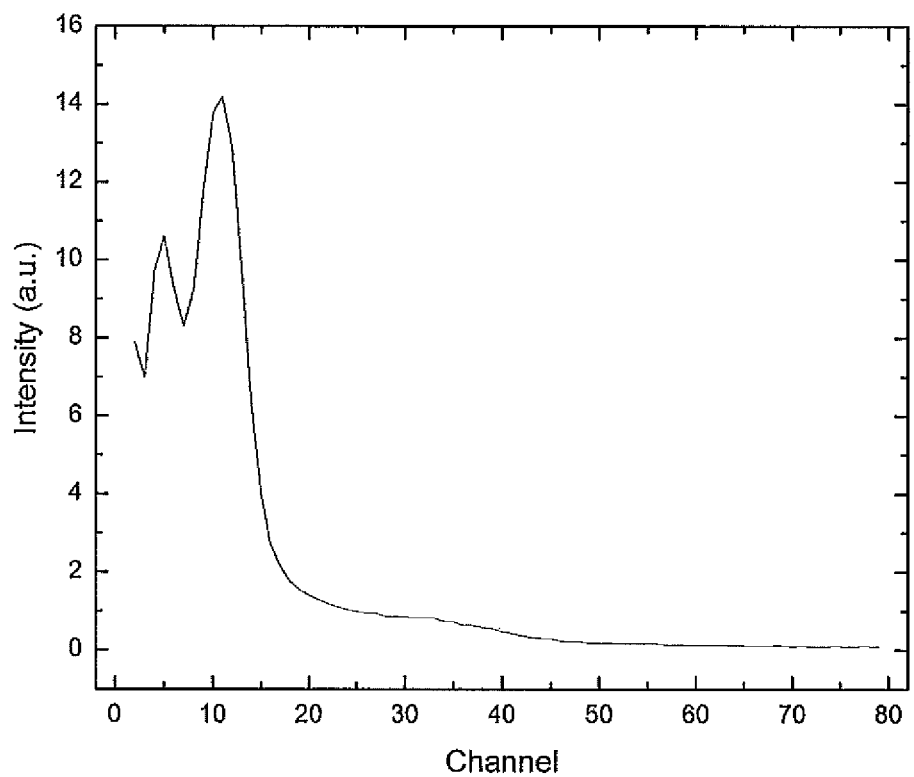
FIG. 18 shows an energy spectrum of $CsGd_2Cl_7$:Ce 3% ($CsGd_{2(1-x)}Ce_{2x}Cl_7$, x=0.03) single crystal under neuron excitation.

In addition to X-ray detection, certain single crystals with a combination of Gd and Ce according to an aspect of the present disclosure can be effective in thermal neutron detection due to the large cross-section for thermal neutron absorption for Gd isotopes, in particular $^{157}Gd$ and $^{155}Gd$. For example, effective thermal neutron detection was observed for $KGd_2Cl_7$ and $CsGd_2Cl_7$. FIG. 12 shows an energy spectrum, measured using a $^{252}Cf$ thermal neutron source, of $KGd_2Cl_7$:Ce 1% ($KGd_{2(1-x)}Ce_{2x}Cl_7$, x=0.01). The sample was shielded from the gamma-rays. Two characteristic photopeaks, at 34 and 74 keV, respectively, are present as a result of interaction of thermal neutrons with Gd. A similar spectrum, measured under the same conditions as for FIG. 12, for another single crystal of $KGd_2Cl_7$:Ce 1% ($KGd_{2(1-x)}Ce_{2x}Cl_7$, x=0.01) is shown in FIG. 13, with photopeaks at about 33 and 77 keV. FIG. 18 shows an energy spectrum, measured under the same conditions as for FIG. 12, of $CsGd_2Cl_7$:Ce 3% ($CsGd_{2(1-x)}Ce_{2x}Cl_7$, x=0.03) single crystal under neuron excitation.

Figure 14:
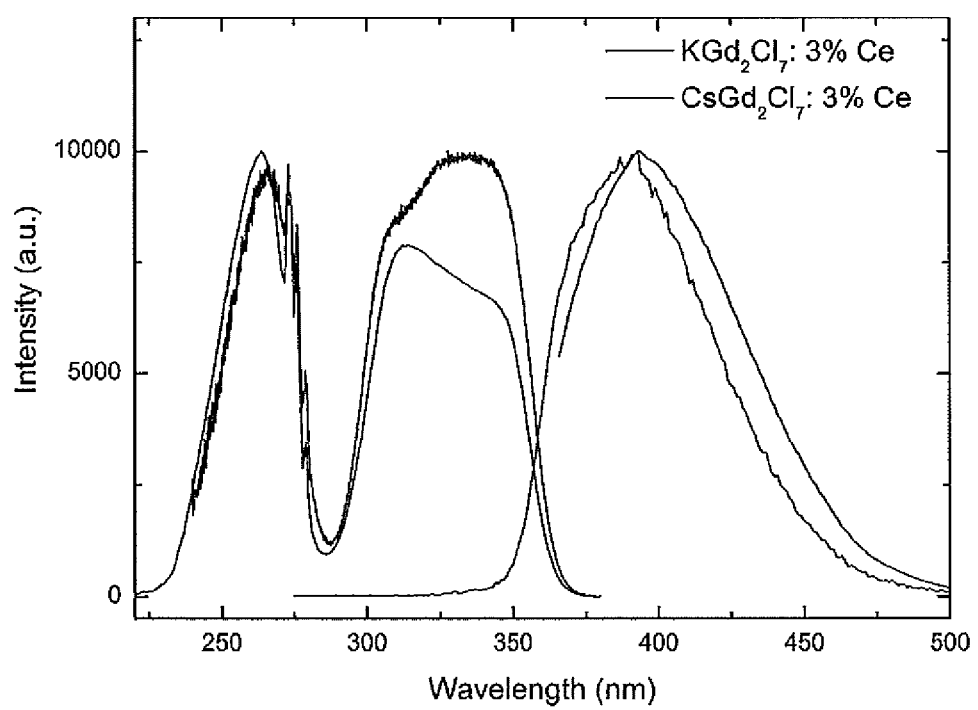
FIG. 14 shows emission and excitation spectra of $KGd_2Cl_7$:Ce 3 at % ($KGd_{2(1-x)}Ce_{2x}Cl_7$, x=0.03) and $CsGd_2Cl_7$:Ce 3 at % ($CsGd_{2(1-x)}Ce_{2x}Cl_7$, x=0.03). The excitation spectra were taken at an excitation wavelength of 265 nm; the emission spectra were taken at an emission wavelength of 395 nm.
Figure 15:
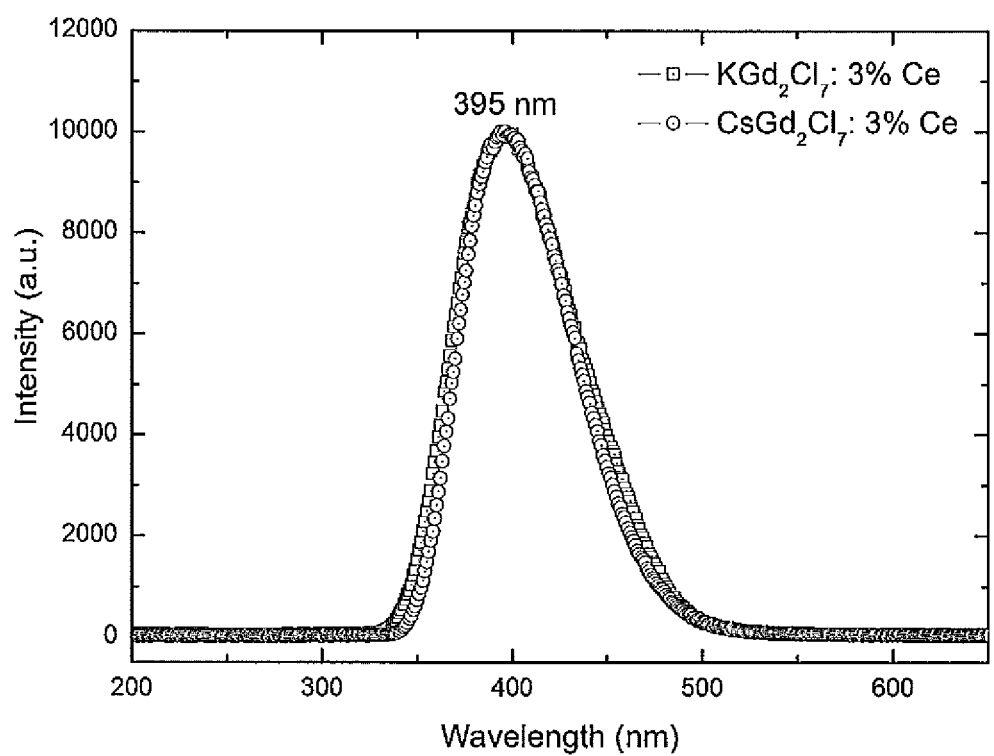
FIG. 15 shows radioluminescence spectra $KGd_2Cl_7$:Ce 3 at % ($KGd_{2(1-x)}Ce_{2x}Cl_7$, x=0.03) and $CsGd_2Cl_7$:Ce 3 at %.
Figure 16:
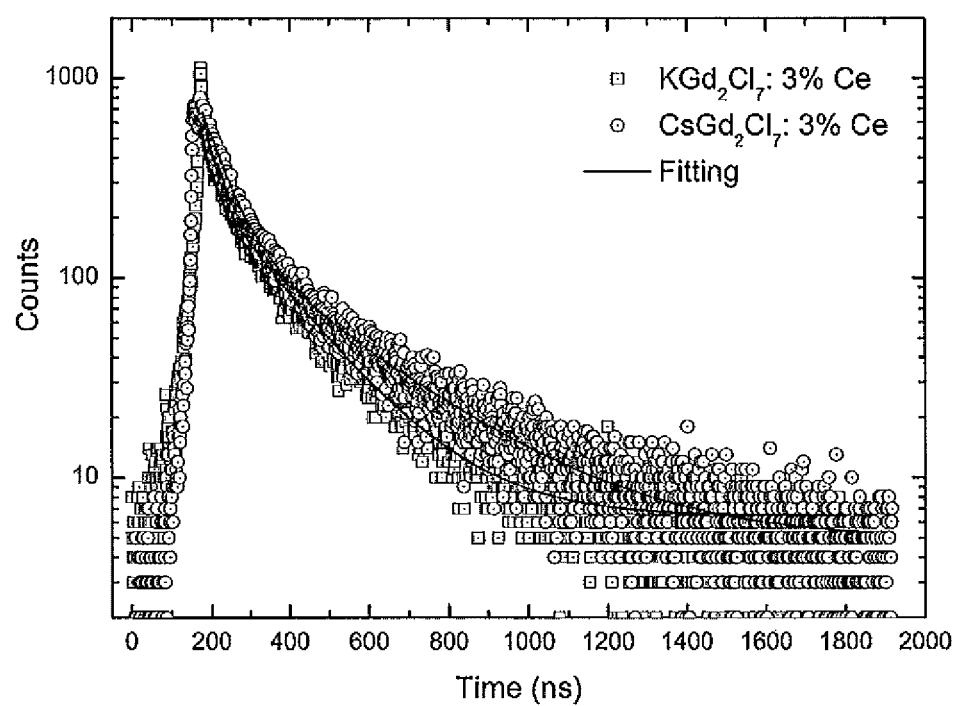
FIG. 16 shows scintillation decay time spectra of $KGd_2Cl_7$:Ce 3% ($KGd_{2(1-x)}Ce_{2x}Cl_7$, x=0.03) and $CsGd_2Cl_7$:Ce 3% ($CsGd_{2(1-x)}Ce_{2x}Cl_7$, x=0.03) single crystals; the spectra were measured using $^{137}Cs$ gamma-ray source (662 keV).

FIG. 14 shows emission and excitation spectra of $KGd_2Cl_7$:Ce 3 at % ($KGd_{2(1-x)}Ce_{2x}Cl_7$, x=0103) and $CsGd_2Cl_7$:Ce 3 at % ($CsGd_{2(1-x)}Ce_{2x}Cl_7$, x=0.03). The excitation spectra were taken at an excitation wavelength of 265 nm; the emission spectra were taken at an emission wavelength of 395 nm. FIG. 15 shows radioluminescence (X-ray excited emission) spectra $KGd_2Cl_7$:Ce 3 at % ($KGd_{2(1-x)}Ce_{2x}Cl_7$, x=0.03) and $CsGd_2Cl_7$:Ce 3 at % ($CsGd_{2(1-x)}Ce_{2x}Cl_7$, x=0.03), showing peaks at about 395 nm. FIG. 16 shows scintillation decay time spectra of $KGd_2Cl_7$:Ce 3% ($KGd_{2(1-x)}Ce_{2x}Cl_7$, x=0.03) and $CsGd_2Cl_7$:Ce 3% ($CsGd_{2(1-x)}Ce_{2x}Cl_7$, x=0.03) single crystals; the spectra were measured using $^{137}$Cs gamma-ray source (662 keV). The scintillation decay profiles of both CsGd2Cl7:Ce 3% (Cs Gd$_{2(1-x)}$Ce$_{2x}$Cl$_7$, x=0.03) and KGd$_2$Cl$_7$:Ce 3% (KGd$_{2(1-x)}$Ce$_{2x}$Cl$_7$, x=0.03) can be described as a double exponential decay with a principal component of ~40-60 ns, which is characteristic of Ce 5d-4f luminescence.

Figure 17:
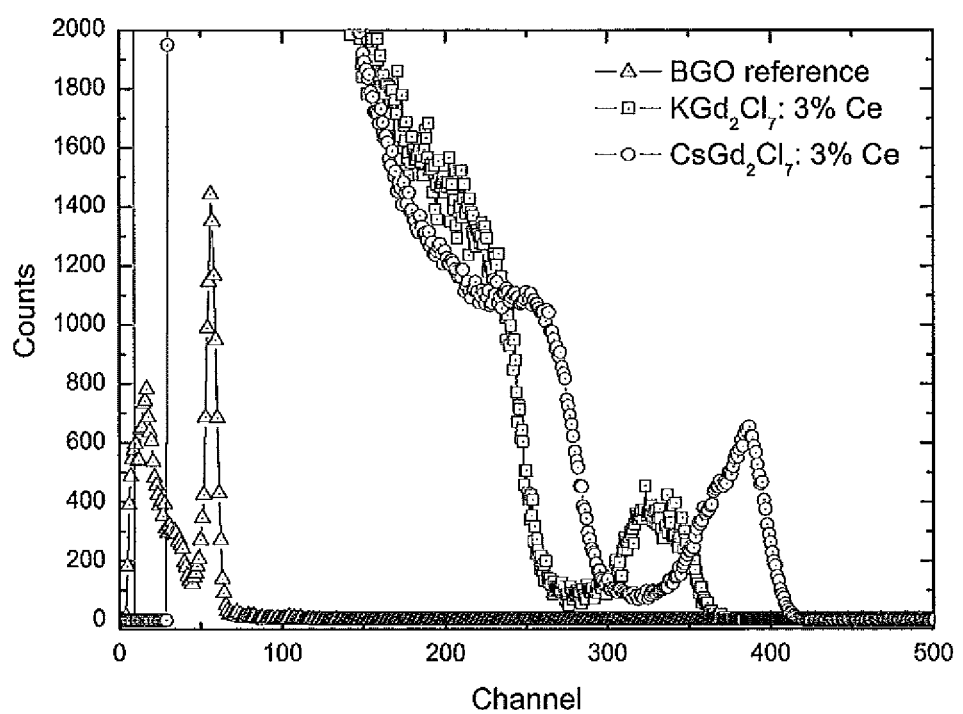
FIG. 17 shows energy spectra of $KGd_2Cl_7$:Ce 3% ($KGd_{2(1-x)}Ce_{2x}Cl_7$, x=0.03) and $CsGd_2Cl_7$:Ce 3% ($CsGd_{2(1-x)}Ce_{2x}Cl_7$, x=0.03) as compared to that of a BGO reference sample; the spectrum was measured using $^{137}Cs$ gamma-ray source (662 keV).

FIG. 17 shows energy spectra of KGd$_2$Cl$_7$:Ce 3% (KGd$_{2(1-x)}$Ce$_{2x}$Cl$_7$, x=0.03) and CsGd$_2$Cl$_7$:Ce 3% (CsGd$_{2(1-x)}$Ce$_{2x}$Cl$_7$, x=0.03) as compared to that of a BGO reference sample; the spectrum was measured using $^{137}$Cs gamma-ray source (662 keV). The 662 keV gamma-ray photopeaks for KGd$_2$Cl$_7$:Ce 3% (KGd$_{2(1-x)}$Ce$_{2x}$Cl$_7$, x=0.03) and CsGd2Cl7:Ce 3% (CsGd$_{2(1-x)}$Ce$_{2x}$Cl$_7$, x=0.03) demonstrate that the relative light output of KGd2Cl7: Ce 3% (KGd$_{2(1-x)}$Ce$_{2x}$Cl$_7$, x=0.03) is more than five (5) times that of BGO, and the relative light output of CsGdCl7:Ce 3% (CsGd$_{2(1-x)}$Ce$_{2x}$Cl$_7$, x=0.03) is more than seven (7) times that of BGO. Table II, which shows in part the light output as a function of Ce concentration, shows that the maximum light output was obtained for a Ce concentration of about 3%. The absolute light output of KGd$_2$Cl$_7$:Ce 3% (KGd$_{2(1-x)}$Ce$_{2x}$Cl$_7$, x=0.03) was calculated to be ~30,000 photons/MeV. The integral quantum efficiency of the PMT according to the emission spectrum of the scintillator was used to calculate the number of photons per unit gamma-ray energy. The energy resolution of the resulting gamma-ray photopeak at 662 keV for the first grown sample was ~10%.

TABLE II

Scintillation decay time and relative light output of KGd$_2$Cl$_7$:Ce (KGd$_{2(1-x)}$Ce$_{2x}$Cl$_7$) crystals as a function of Ce concentration.

| Ce concentration (at %) | Scintillation decay time (ns) | Light output (channel # (BGO = 100)) |
|---|---|---|
| 0.5 | 55 (30%) + 200 (70%) | 340 |
| 1 | 40 (27%) + 200 (73%) | 350 |
| 2 | 50 (43%) + 200 (57%) | 440 |
| 3 | 50 (40%) + 200 (60%) | 510 |
| 4 | 60 (30%) + 200 (70%) | 430 |
| 5 | 60 (45%) + 300 (55%) | 400 |

III. Summary

Thus, chloride scintillator crystals with excellent scintillation properties have been produced according to the present disclosure. Because many embodiments of the invention can be made without departing from the spirit and scope of the invention, the invention resides in the claims hereinafter appended.

We claim:

1. A scintillator material comprising a single crystal having a composition of the formula A$_3$MCl$_6$, wherein A consists essentially of Cs, and M consists essentially of Ce and Gd, and
wherein Ce is present at a concentration such that about 1-10 at % of M is Ce (0.01≤x≤0.1, approximately).

2. The scintillator material of claim 1, comprising a single crystal having a composition of the formula Cs$_3$CeCl$_6$.

3. The scintillator material of claim 2, having a light output of at least about four times that of BGO when excited with a gamma-ray of 662 keV.

4. A scintillator material comprising a single crystal having a composition of the formula AM$_2$Cl$_7$, wherein A consists essentially of Li, Na K, Rb, Cs or any combination thereof, and
M consists essentially of Ce, Sc, Y, La, Lu, Gd, Pr, Tb, Yb, Nd or any combination thereof
wherein the single crystal has a composition of the formula KGd$_{2(1-x)}$Ce$_{2x}$Cl$_7$, and
wherein Ce is present at a concentration such that about 1-10 at % of M is Ce (0.01≤x≤0.1, approximately).

5. The Scintillator material of claim 4, comprising a single crystal having a composition of the formula CsCe$_2$Cl$_7$.

6. The Scintillator material of claim 4, wherein Ce is present at a concentration such that about 3 at % of M is Ce (x=0.03, approximately).

7. The Scintillator material of claim 4, where in A consists essentially of Cs, and M consists essentially of Ce and Gd.

8. The Scintillator material of claim 7, wherein Ce is present at a concentration such that about 1-10 at % of M is Ce (0.01≤x≤0.1, approximately).

9. The Scintillator material of claim 8, wherein Ce is present at a concentration such that about 3 at % of M is Ce (x=0.03, approximately).

10. The scintillator material of claim 7, having a light output of at least about five times that of BGO when excited with a gamma-ray of 662 keV.

11. The scintillator material of claim 4, having a light output of at least about five times that of BGO when excited with a gamma-ray of 662 keV.

12. A radiation detector, comprising:
a scintillator material of claim 1 adapted to generate photons in response to an impinging radiation; and
a photon detector optically coupled to the scintillator material, arranged to receive the photons generated by the scintillator material and adapted to generate an electrical signal indicative of the photon generation.

13. An imaging method, comprising:
using at least one radiation detector of claim 12 to receive radiation from a plurality of radiation sources distributed in an object to be imaged and generate a plurality of signals indicative of the received radiation; and
based on the plurality of signals, deriving a special distribution of an attribute of the object.

14. A method of making a scintillator material, the method comprising:
synthesizing a compound having a composition of the formula A$_3$MCl$_6$, wherein A consists essentially of Cs, and
M consists essentially of Ce, and Gd, wherein Ce is present at a concentration such that about 1-10 at % of M is Ce (0.01≤x≤0.1, approximately); and
growing a single crystal of the formula A$_3$MCl$_6$ from the synthesized compound using Bridgman method.

15. The method of claim 14, where in the synthesizing step comprises heating a mixture of a plurality of chlorides above their respective melting temperatures.

16. A method of making a scintillator material, the method comprising:
synthesizing a compound having a composition of the formula AM$_2$Cl$_7$, wherein A consists essentially of Cs, and
M consists essentially of Ce, Gd, wherein Ce is present at a concentration such that about 1-10 at % of M is Ce (0.01≤x≤0.1, approximately); and growing a single crystal of the formula $AM_2Cl_7$ from the synthesized compound using Bridgman method.

17. The method of claim 16, where in the synthesizing step comprises heating a mixture of a plurality of chlorides above their respective melting temperatures.

18. A radiation detector, comprising:
a scintillator material of claim 4 adapted to generate photons in response to an impinging radiation; and
a photon detector optically coupled to the scintillator material, arranged to receive the photons generated by the scintillator material and adapted to generate an electrical signal indicative of the photon generation.

19. An imaging method, comprising:
using at least one radiation detector of claim 18 to receive radiation from a plurality of radiation sources distributed in an object to be imaged and generate a plurality of signals indicative of the received radiation; and
based on the plurality of signals, deriving a special distribution of an attribute of the object.

* * * * *